US012643185B2

(12) United States Patent
Mori et al.

(10) Patent No.: US 12,643,185 B2
(45) Date of Patent: Jun. 2, 2026

(54) METHOD OF TRANSPORTING WORKPIECE AND PROCESSING APPARATUS

(71) Applicant: Tokyo Electron Limited, Tokyo (JP)

(72) Inventors: Kiyoshi Mori, Tokyo (JP); Haruhiko Furuya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 658 days.

(21) Appl. No.: 17/969,923

(22) Filed: Oct. 20, 2022

(65) Prior Publication Data

US 2023/0128473 A1 Apr. 27, 2023

(30) Foreign Application Priority Data

Oct. 22, 2021 (JP) .................................. 2021-172990

(51) Int. Cl.
*C23C 16/458* (2006.01)
*B23Q 1/44* (2006.01)
(Continued)

(52) U.S. Cl.
CPC ............ *B23Q 1/44* (2013.01); *C23C 16/4584* (2013.01); *H10P 72/7612* (2026.01); *H10P 72/7618* (2026.01); *H10P 72/50* (2026.01)

(58) Field of Classification Search
CPC ......... H01L 21/68742; H01L 21/67259; H01L 21/68764; H01L 21/68; H01L 21/67742;
(Continued)

(56) References Cited

U.S. PATENT DOCUMENTS 6,676,761 B2 * 1/2004 Shang ............... H01L 21/68742
118/728
10,777,435 B2 * 9/2020 Matsuura ................ H01L 21/68
(Continued)

FOREIGN PATENT DOCUMENTS

JP 2000-340620 A 12/2000
JP 2005-50904 A 2/2005
(Continued)

OTHER PUBLICATIONS

JP-2014187314-A (Translated Document); Inventor: Kuranaga Yasuhisa; Date Published: Oct. 2, 2014; Date Filed: Date Filed Mar. 25, 2013 (Year: 2014).*

*Primary Examiner* — Mahdi H Nejad
(74) *Attorney, Agent, or Firm* — Nath, Goldberg & Meyer; Jerald L. Meyer; Tanya E. Harkins

(57) ABSTRACT

A method of transporting a workpiece includes steps of: (a) adjusting an inclination of a stage including a placement surface on which the workpiece is to be placed such that the placement surface is inclined with respect to a horizontal plane; (b) receiving the workpiece from a transport apparatus configured to transport the workpiece by raising lift pins provided in the stage, before or after step (a); (c) placing the workpiece on the inclined placement surface by performing at least one of lowering the lift pins and raising the stage; and (d) adjusting the inclination of the stage such that the placement surface on which the workpiece is placed is parallel to the horizontal plane.

16 Claims, 13 Drawing Sheets

(51) Int. Cl.

| | | |
|---|---|---|
| *C23C 16/00* | (2006.01) | |
| *H10P 72/76* | (2026.01) | |
| *H10P 72/50* | (2026.01) | |

(58) Field of Classification Search
CPC ............. H01L 21/6875; H10P 72/7612; H10P 72/7618; H10P 72/0606; H10P 72/50; H10P 72/7626; H10P 72/7624; C23C 16/4584; C23C 16/458; C23C 16/4583; C23C 16/52
USPC .................................................. 118/728, 500
See application file for complete search history.

(56) References Cited

U.S. PATENT DOCUMENTS

| | | | | |
|---|---|---|---|---|
| 10,883,190 | B2 * | 1/2021 | Tong ........................ C30B 25/10 | |
| 2003/0044529 | A1 * | 3/2003 | Wu ..................... H01L 21/6715 | |
| | | | | 427/240 |
| 2004/0244694 | A1 * | 12/2004 | Hayashi ............. H01L 21/6875 | |
| | | | | 118/728 |
| 2006/0005770 | A1 * | 1/2006 | Tiner ................ H01L 21/68742 | |
| | | | | 414/935 |
| 2010/0000470 | A1 * | 1/2010 | Sakata ................ C23C 16/4585 | |
| | | | | 118/728 |
| 2011/0236162 | A1 * | 9/2011 | Shikayama ....... H01L 21/68742 | |
| | | | | 414/222.01 |
| 2018/0350644 | A1 * | 12/2018 | Matsuura ............ H10P 72/0606 | |
| 2019/0035671 | A1 * | 1/2019 | Ha .................... H01L 21/68742 | |
| 2020/0185257 | A1 * | 6/2020 | Nishiwaki ......... H01L 21/67742 | |
| 2023/0207376 | A1 * | 6/2023 | Mori ................. H01L 21/68764 | |
| | | | | 414/217 |
| 2024/0141494 | A1 * | 5/2024 | Mori ................... C23C 16/4584 | |
| 2024/0162076 | A1 * | 5/2024 | Mori ....................... H01L 21/31 | |
| 2024/0194507 | A1 * | 6/2024 | Moriya ............ H01L 21/67207 | |
| 2025/0198001 | A1 * | 6/2025 | Jang .................... B05B 13/0278 | |
| 2025/0354259 | A1 * | 11/2025 | Tojo ................... C23C 16/4405 | |

FOREIGN PATENT DOCUMENTS

| | | | | | | |
|---|---|---|---|---|---|---|
| JP | 2012238758 | A | * | 12/2012 | | |
| JP | 2014187314 | A | * | 10/2014 | | |
| JP | 2018022724 | A | * | 2/2018 | | |
| JP | 202053627 | A | | 4/2020 | | |
| KR | 20130015614 | A | * | 2/2013 | | |
| KR | 10-2018-0016281 | A | | 2/2018 | | |
| KR | 10-2020-0021293 | A | | 2/2020 | | |
| KR | 10-2020-0036723 | A | | 4/2020 | | |
| KR | 102763718 | B1 | * | 2/2025 | ............. | H01L 21/68 |

* cited by examiner

Controller 31 30

Figure 1:
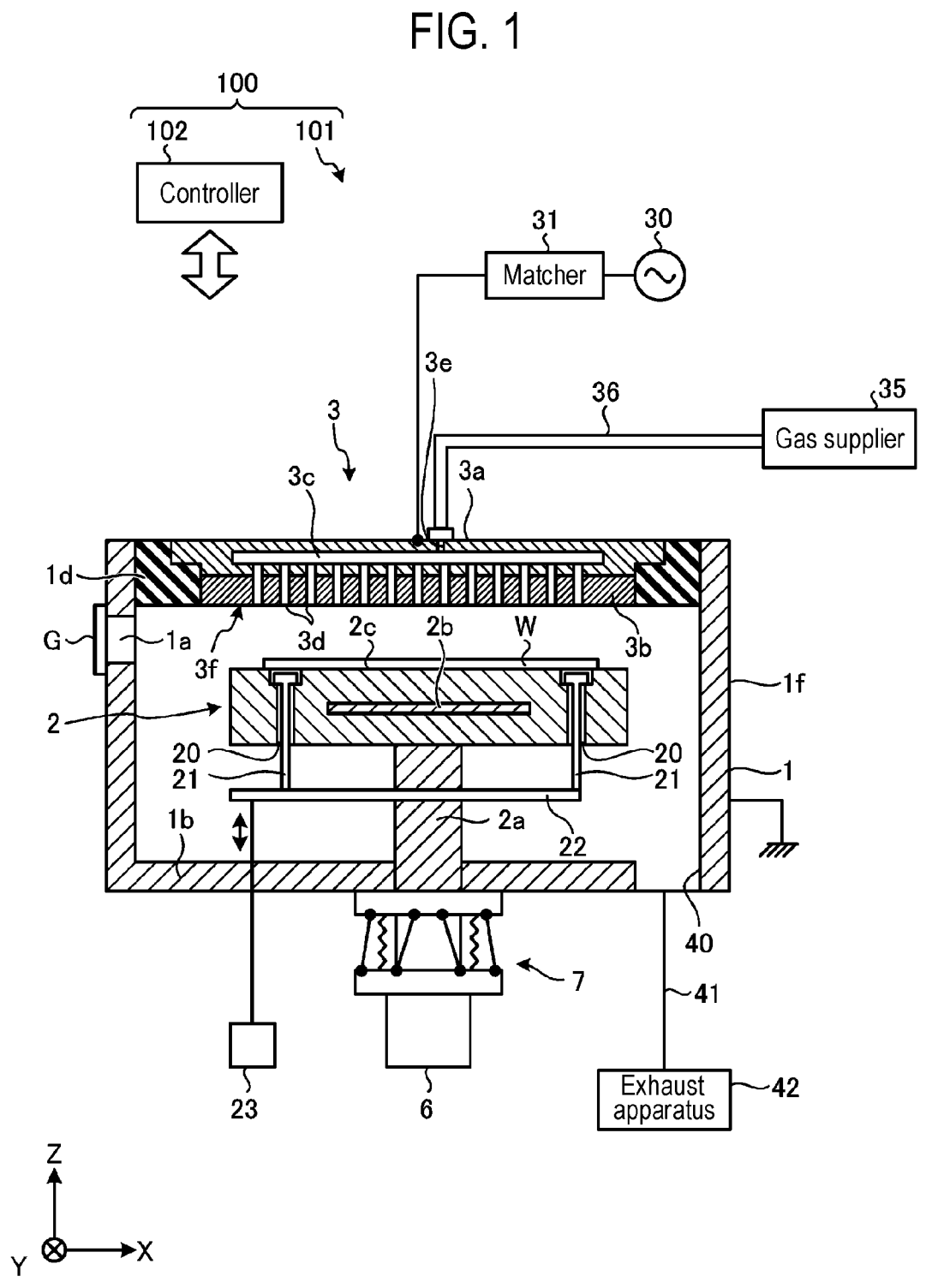

Matcher ∿

3e 36 35

Gas supplier

3

3c

3a

1d

G

1a 3f 3d 2c 2b W 3b

2

20 20
21 21

1f

1

1b 2a

22

40

7

41

23 6

Exhaust apparatus 42

Z

Y X

W a     Rcos θ     a

θ

2c

2

θ

Z

Y ⊗ → X

METHOD OF TRANSPORTING WORKPIECE AND PROCESSING APPARATUS

CROSS-REFERENCE TO RELATED APPLICATION

This application is based upon and claims the benefit of priority from Japanese Patent Application No. 2021-172990, filed on Oct. 22, 2021, the entire contents of which are incorporated herein by reference.

TECHNICAL FIELD

The present disclosure relates to a workpiece transport method and a processing apparatus.

BACKGROUND

Patent Document 1 discloses a technology of receiving a workpiece that is transported above a stage by a transport apparatus by raising lift pins having different lengths from the stage, and then placing the workpiece on a placement surface of the stage by lowering the lift pins.

PRIOR ART DOCUMENTS

Patent Documents

Patent Document 1: Japanese Laid-Open Publication No. 2020-53627

SUMMARY

According to one embodiment of the present disclosure, there is provided a method of transporting a workpiece. The method includes steps of: (a) adjusting an inclination of a stage including a placement surface on which the workpiece is to be placed such that the placement surface is inclined with respect to a horizontal plane; (b) receiving the workpiece from a transport apparatus configured to transport the workpiece by raising lift pins provided in the stage, before or after step (a); (c) placing the workpiece on the inclined placement surface by performing at least one of lowering the lift pins and raising the stage; and (d) adjusting the inclination of the stage such that the placement surface on which the workpiece is placed is parallel to the horizontal plane.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a schematic cross-sectional view illustrating an example of the configuration of a vacuum processing apparatus according to an embodiment.

DETAILED DESCRIPTION

Figure 2:
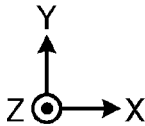
FIG. 2 is a top view of a stage according to an embodiment, viewed from above.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a workpiece transport method and a processing apparatus disclosed herein will be described in detail with reference to the drawings. The technology disclosed herein is not limited by the following embodiments.

In the related arts described above, the workpiece is supported in an inclined posture with respect to the horizontal plane by lift pins having different lengths. The workpiece, which is supported in the inclined posture by the lift pins having different lengths, gradually comes into contact with the placement surface of the stage from the relative low edge side of the workpiece when the lift pins are lowered and is finally placed on the placement surface in a horizontal posture. As a result, even if gas remains between the workpiece and the placement surface of the stage, since the remaining gas can be released from the relatively high edge side of the workpiece, the displacement of the workpiece on the placement surface of the stage caused by the remaining gas is suppressed.

However, when the workpiece is received from the transport apparatus by the lift pins having different lengths, the load due to contact with the workpiece concentrates on a relatively long lift pin. For this reason, there is a risk that the relatively long lift pin will wear out more than the other lift pins and generate dust.

Therefore, it is expected to suppress the positional deviation of the workpiece on the placement surface of the stage and the generation of dust from the lift pins.

[Configuration of Vacuum Processing Apparatus 100]

FIG. 1 is a schematic cross-sectional view illustrating an example of the configuration of a vacuum processing apparatus (an example of a processing apparatus) 100 according to an embodiment. The vacuum processing apparatus 100 illustrated in FIG. 1 is an apparatus that performs film formation in a vacuum atmosphere. For example, the vacuum processing apparatus 100 illustrated in FIG. 1 is an apparatus that performs a chemical vapor deposition (CVD) process using plasma on a substrate W.

The vacuum processing apparatus 100 includes a processing container 1 which is formed of a metal, such as aluminum or nickel with an anodized film formed on the surface thereof, in a substantially cylindrical shape. The processing container 1 includes a bottom wall 1b and a side wall 1f. The processing container 1 is grounded. The processing container 1 is configured to be hermetically sealed such that the interior thereof can be maintained in a vacuum atmosphere. The side wall 1f of the processing container 1 is provided with an opening 1a for carry-in and carry-out of a target substrate (e.g., a workpiece) W such as a semiconductor wafer. A gate valve G opens and closes the opening 1a.

A stage 2 on which a substrate W is to be placed is installed inside the processing container 1. The stage 2 is made of a metal such as aluminum or nickel, aluminum nitride (AlN) in which a metal mesh electrode is embedded, or the like, and is formed in a flat and substantially columnar shape. A substrate W is placed on the top surface of the stage 2. That is, the top surface of the stage 2 is a placement surface 2c on which a substrate W can be placed. The stage 2 also functions as a lower electrode. The stage 2 is supported from below by a support member 2a. The support member 2a is formed in a substantially cylindrical shape, extends vertically downward from the stage 2, and penetrates the bottom wall 1b of the processing container 1. A lower end portion of the support member 2a is located outside the processing container 1 and connected to a rotational driving mechanism 6. The support member 2a is rotated by the rotational driving mechanism 6. The stage 2 is configured to be rotatable according to the rotation of the support member 2a. An adjustment mechanism 7 is provided at the lower end portion of the support member 2a. The adjustment mechanism 7 may adjust the position and inclination of the stage 2 by changing the position and inclination of the support member 2a.

A heater 2b is provided in the stage 2. The heater 2b generates heat according to the power supplied from the exterior of the processing container 1 to heat the substrate W placed on the stage 2. Although not illustrated, a flow path to which a coolant of which the temperature is controlled by a chiller unit provided outside the processing container 1 is supplied is formed inside the stage 2. The stage 2 may control the temperature of the substrate W to a predetermined temperature through heating by the heater 2b and cooling by the coolant supplied from the chiller unit. The stage 2 may not be provided with the heater 2b, and the temperature control of the substrate W may be performed by the coolant supplied from the chiller unit.

Although not illustrated, an electrode for generating an electrostatic force by a voltage supplied from the exterior is embedded inside the stage 2. Due to the electrostatic force generated from this electrode, the stage 2 is able to attract and hold a substrate W placed on the top surface thereof (that is, the placement surface 2c).

In addition, as illustrated in FIGS. 1 and 2, the stage 2 is provided with lift pins 21 to be movable upward and downward from the placement surface 2c. FIG. 2 is a top view of the stage 2 as viewed from above in an embodiment. FIG. 2 illustrates the disk-shaped placement surface 2c of the stage 2. The stage 2 is provided with pin through holes 20 (e.g., three), and the lift pins 21 are disposed inside these pin through holes 20, respectively. The pin through holes 20 and the lift pins 21 are arranged at regular intervals along the circumferential direction of the placement surface 2c. FIG. 2 illustrates the arrangement positions of the pin through holes 20 and the lift pins 21. The pin through-holes 20 and the lift pins 21 are arranged, for example, such that the angle between line segments connecting the center O of the placement surface 2c and respective pin through holes 20 is 120 degrees.

Return to a description made with reference to FIG. 1. The pin through holes 20 are formed to penetrate the placement surface 2c (the top surface) of the stage 2 to the rear surface (the bottom surface) with respect to the placement surface 2c. The lift pins 21 are slidably inserted into the pin through holes 20, respectively. In the state in which the lift pins 21 are lowered with respect to the stage 2, the upper ends of the lift pins 21 are suspended from the placement surface sides of the pin through holes 20. That is, the upper ends of the lift pins 21 have a diameter larger than that of the pin through holes 20, and recesses having a diameter and a thickness larger than those of the upper ends of the lift pins 21 are formed at the upper ends of the pin through holes 20 to be capable of accommodating the upper ends of the lift pins 21, respectively. The upper ends of the lift pins 21 is accommodated in the recesses of the pin through holes 20 to be suspended from the placement surface sides of the pin through holes 20.

The lift pins 21 have the same length. The lift pins 21 are float-type lift pins, and the lower ends thereof protrude from the rear surface of the stage 2 toward the bottom wall 1b of the processing container 1 and are capable of abutting on a lifting member 22. The lifting member 22 is connected to a driving mechanism 23 to be raised or lowered in response to drive control by the driving mechanism 23. As the lifting member 22 is raised or lowered, the lift pins 21 are raised or lowered with respect to the placement surface 2c of the stage 2.

Above the stage 2, there is provided a shower head 3 formed of a conductive metal such as aluminum or nickel in a substantially disk-like shape. The space between the bottom surface of the shower head 3 and the top surface of the stage 2 is a processing space in which a film forming process is performed. The shower head 3 is supported on an upper portion of the processing container 1 via an insulating member 1d such as ceramic. As a result, the processing container 1 and the shower head 3 are electrically insulated from each other. The shower head 3 constitutes the ceiling of the processing container 1.

The shower head 3 includes a ceiling plate 3a and a shower plate 3b. The ceiling plate 3a is installed to block the interior of the processing container 1 from above. The shower plate 3b is installed below the ceiling plate 3a to face the stage 2. A gas diffusion chamber 3c is formed in the ceiling plate 3a. Gas ejection holes 3d communicating with the gas diffusion chamber 3c are formed in the ceiling plate 3a and the shower plate 3b.

The ceiling plate 3a includes a gas introduction port 3e formed to introduce a gas into the gas diffusion chamber 3c. A gas supplier 35 is connected to the gas introduction port 3e via a pipe 36. The gas supplier 35 includes gas sources for various gases used in a film forming process, and gas supply lines connected to the respective gas supply sources. Each gas supply line is provided with a control device for controlling gas flow, such as a valve and a flow rate controller. The gas supplier 35 supplies various gases, the flow rates of which are controlled by the control device installed on each gas supply line, to the shower head 3 through the pipe 36. The gases supplied to the shower head 3 are diffused in the gas diffusion chamber 3c and ejected into the processing space below the shower head 3 from each gas ejection hole 3d.

In addition, the shower plate 3b is paired with the stage 2 and functions as an electrode plate for forming capacitively coupled plasma (CCP) in the processing space. A radio frequency (RF) power supply 30 is connected to the shower head 3 via a matcher 31. The RF power supply 30 supplies RF power to the shower head 3 via a matcher 31. The RF power supplied from the RF power supply 30 to the shower head 3 is supplied from the bottom surface of the shower head 3 into the processing space. The gas supplied into the processing space is plasmatized by the RF power supplied into the processing space. The RF power supply 30 may supply RF power to the stage 2 instead of the shower head 3. In this case, the shower head 3 is grounded. The RF power supply 30 may supply both the stage 2 and the shower head 3 with RF power of different frequencies and magnitudes.

An exhaust port 40 is formed in the bottom wall 1b of the processing container 1. An exhaust apparatus 42 is connected to the exhaust port 40 via a pipe 41. The exhaust apparatus 42 includes a vacuum pump, a pressure control valve, and the like. The interior of the processing container 1 may be depressurized to a predetermined degree of vacuum by the exhaust apparatus 42.

A controller 102 includes a memory, a processor, and an input/output interface. The memory stores, for example, a program executed by the processor and a recipe including conditions for each process. The processor executes a program read from the memory, and controls each part of the main body 101 via an input/output interface based on the recipe stored in the memory.

[Processing Operation During Carry-In of Substrate]

In the vacuum processing apparatus 100, when a substrate W transported into the processing container 1 by the transport apparatus is placed on the placement surface 2c of the stage 2, a positional deviation in which the substrate W is caused to float or slip laterally by the gas remaining between the substrate W and the placement surface 2c may occur on the placement surface 2c. The positional deviation of the substrate W on the placement surface 2c of the stage 2 causes a decrease in the uniformity of processing on the substrate W, which is not preferable.

In connection with this, a technology has been proposed in which a substrate W is received by raising lift pins having different lengths from the stage 2, and then the substrate W is placed on the placement surface 2c of the stage 2 by lowering the lift pins having different lengths. In such a technology, the substrate W is supported in an inclined posture with respect to the horizontal plane by the lift pins having different lengths. The substrate W, which is supported in the inclined posture by the lift pins having different lengths, gradually comes into contact with the placement surface 2c of the stage 2 from the relatively low edge side of the substrate W when the lift pins are lowered, and are finally placed on the placement surface 2c in a horizontal posture. As a result, when gas remains between the substrate W and the placement surface 2c of the stage 2, the remaining gas can be released from the relatively high edge side of the substrate W, so the positional deviation of the substrate W on the placement surface 2c of the stage 2 due to the remaining gas is suppressed.

However, in the above-described technology, when the workpiece is received from a transport apparatus by the lift pins having different lengths, the load associated with contact with the substrate W concentrates on a relatively long lift pin. For this reason, there is a risk that the relatively long lift pin will wear out more than the other lift pins and generate dust.

Therefore, in the vacuum processing apparatus 100 of the present embodiment, when the substrate W is transported into the processing container 1 by the transport apparatus, the inclination of the stage 2 is adjusted by the adjustment mechanism 7 so that the placement surface 2c is inclined with respect to the horizontal plane. Then, the vacuum processing apparatus 100 horizontally receives the substrate W from the transport apparatus that transports the substrate W by lifting the lift pins 21 from the stage 2, and places the substrate W on the inclined placement surface 2c by lowering the lift pins 21. As a result, even if gas remains between the substrate W and the placement surface 2c of the stage 2, since the remaining gas can be released from the relatively low edge side of the placement surface 2c, it is possible to suppress the positional deviation of the substrate W on the placement surface 2c of the stage 2 due to the remaining gas. In addition, since the substrate W is horizontally received by the lift pins 21, the load associated with the contact between the lift pins 21 and the substrate W can be distributed to each of the lift pins 21, and thus the wear of a specific lift pin 21 can be reduced. As a result, with the vacuum processing apparatus 100 of the present embodiment, it is possible to suppress the positional deviation of the substrate W on the placement surface 2c of the stage 2 and dust generation from the lift pins 21.

Figure 3:
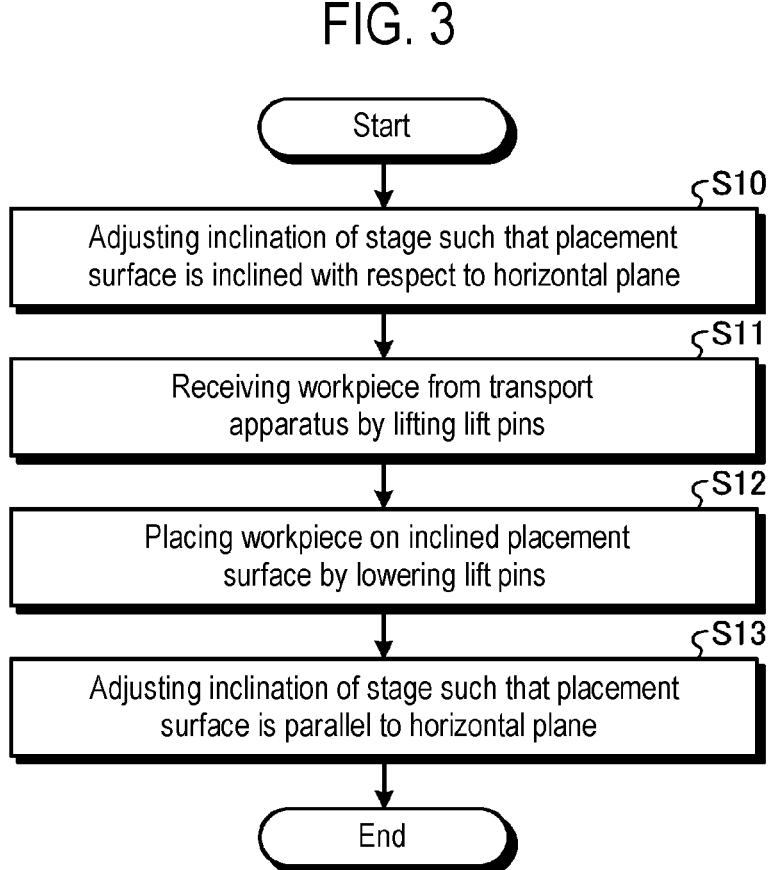
FIG. 3 is a flowchart illustrating an example of processing operations during carry-in of a substrate in the vacuum processing apparatus according to an embodiment.

FIG. 3 is a flowchart illustrating an example of processing operations during carry-in of a substrate W in the vacuum processing apparatus 100 according to an embodiment. FIGS. 4 to 7 are views illustrating a specific example of processing operations during carry-in of a substrate W in the vacuum processing apparatus 100 according to an embodiment. Each step illustrated in FIG. 3 is implemented by the controller 102 controlling each part of the main body 101.

Figure 4:
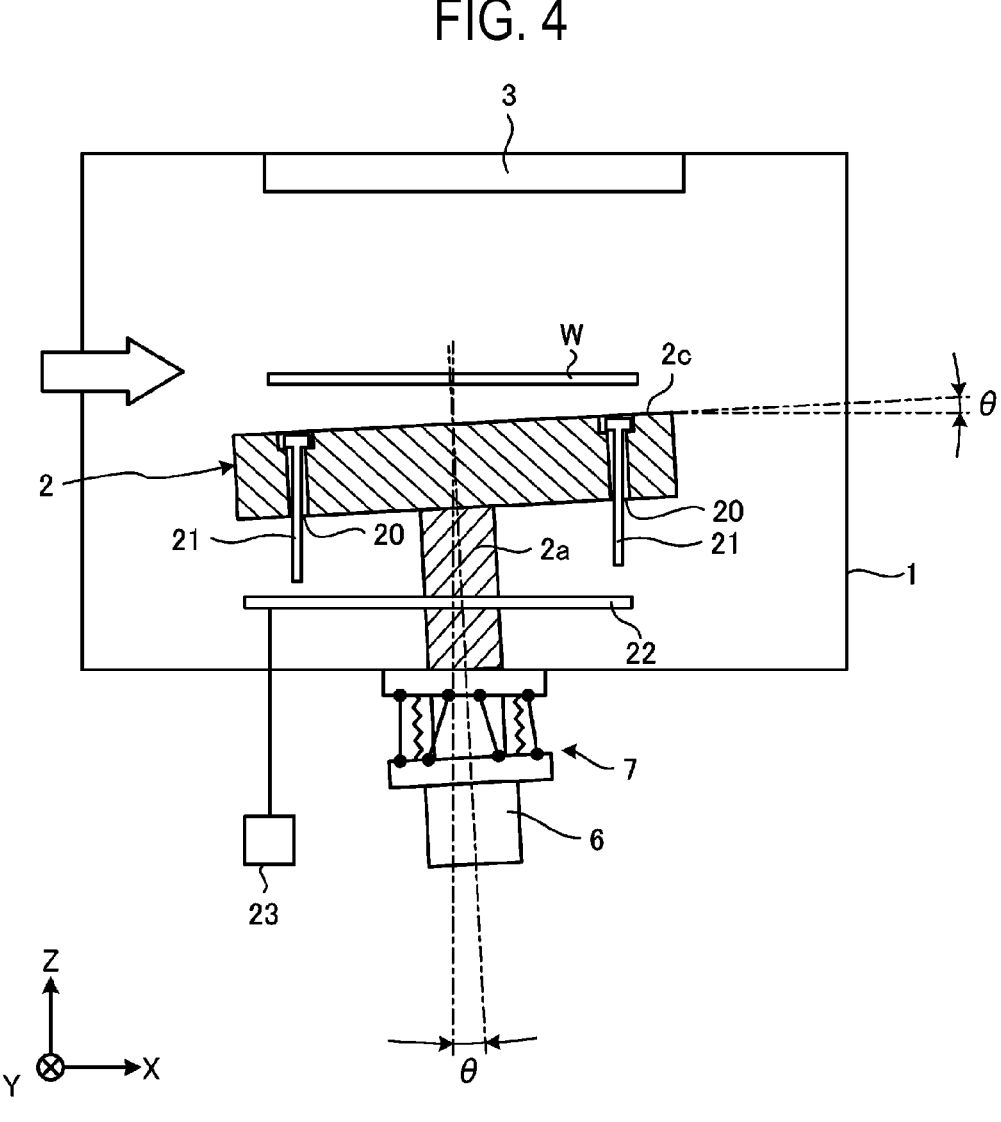
FIG. 4 is a view illustrating a specific example of a processing operation during carry-in of a substrate in the vacuum processing apparatus according to an embodiment.

The inclination of the stage 2 is set such that the placement surface 2c is parallel to the horizontal plane during the period in which the carry-in/out of the substrate W is not performed. During the carry-in of the substrate W, the controller 102 adjusts the inclination of the stage 2 such that the placement surface 2c is inclined with respect to the horizontal plane (step S10, first inclination adjusting step). That is, for example, as illustrated in FIG. 4, the controller 102 controls the adjustment mechanism 7 to adjust the inclination of the stage 2 such that the placement surface 2c is inclined at an inclination angle θ with respect to the horizontal plane. At this time, the controller 102 adjusts the inclination of the stage 2 such that the placement surface 2c is inclined in a posture in which the height (the height of the placement surface 2c) at the position of a specific lift pin 21 (the left lift pin 21 in FIG. 4) among the lift pins 21 is the lowest height. The inclination angle θ of the placement surface 2c with respect to the horizontal plane is preferably, for example, 0.5 degrees or more and 2 degrees or less from the viewpoint of suppressing the slide-down of the substrate W from the placement surface 2c when the substrate W is placed on the placement surface 2c, and the viewpoint of implementing degassing from the gap between the placement surface 2c and the substrate W. Next, the transport apparatus holds the substrate W on its arm, carries the substrate W into the processing container 1, and moves the substrate above the stage 2.

Figure 5:
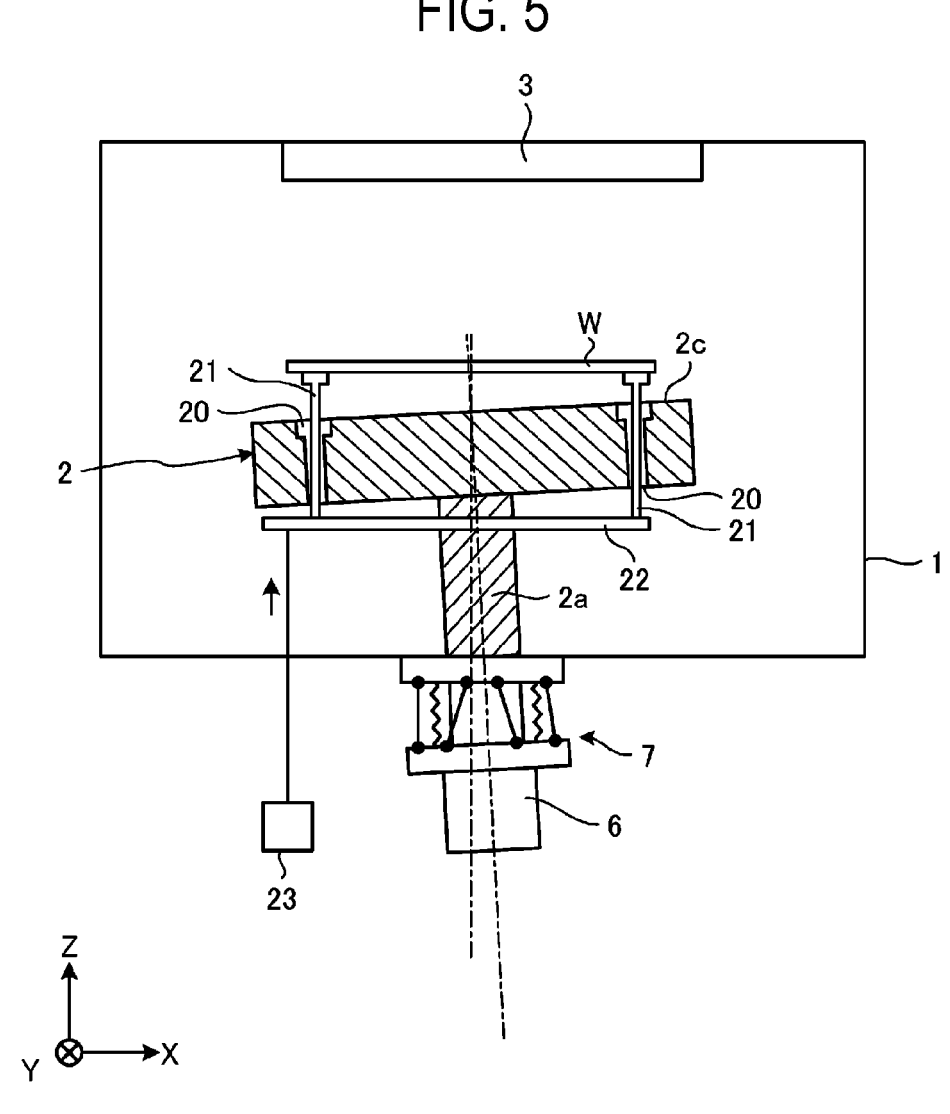
FIG. 5 is a view illustrating a specific example of a processing operation during carry-in of a substrate in the vacuum processing apparatus according to an embodiment.

When the substrate W reaches above the stage 2, the controller 102 raises the lift pins 21 to receive the substrate W from the transport apparatus (step S11, receiving step). That is, for example, as illustrated in FIG. 5, the controller 102 controls the driving mechanism 23 to raise the lifting member 22 and bring the lifting member 22 into contact with the lower ends of the lift pins 21. When the lifting member 22 is raised, the lift pins 21 supported by the lifting member 22 are raised together with the lifting member 22, protrude from the placement surface 2c of the stage 2, and receive the substrate W from the transport apparatus. Since the lift pins 21 protruding from the placement surface 2c of the stage 2 have the same length, the tips of the lift pins 21 are located on the same horizontal plane. Therefore, the substrate W is horizontally received and supported by the lift pins 21. Since the substrate W is horizontally received by the lift pins 21 in this way, the load associated with the contact between the lift pins 21 and the substrate W can be distributed to each of the lift pins 21, and as a result, dust generation due to wear of a specific lift pin 21 can be suppressed.

In addition, the order of the first inclination adjusting step (step S10) and the receiving step (step S11) may be interchanged. That is, after receiving the substrate W by the lift pins 21, the inclination of the stage 2 may be adjusted such that the placement surface 2c is inclined with respect to the horizontal plane.

Figure 6:
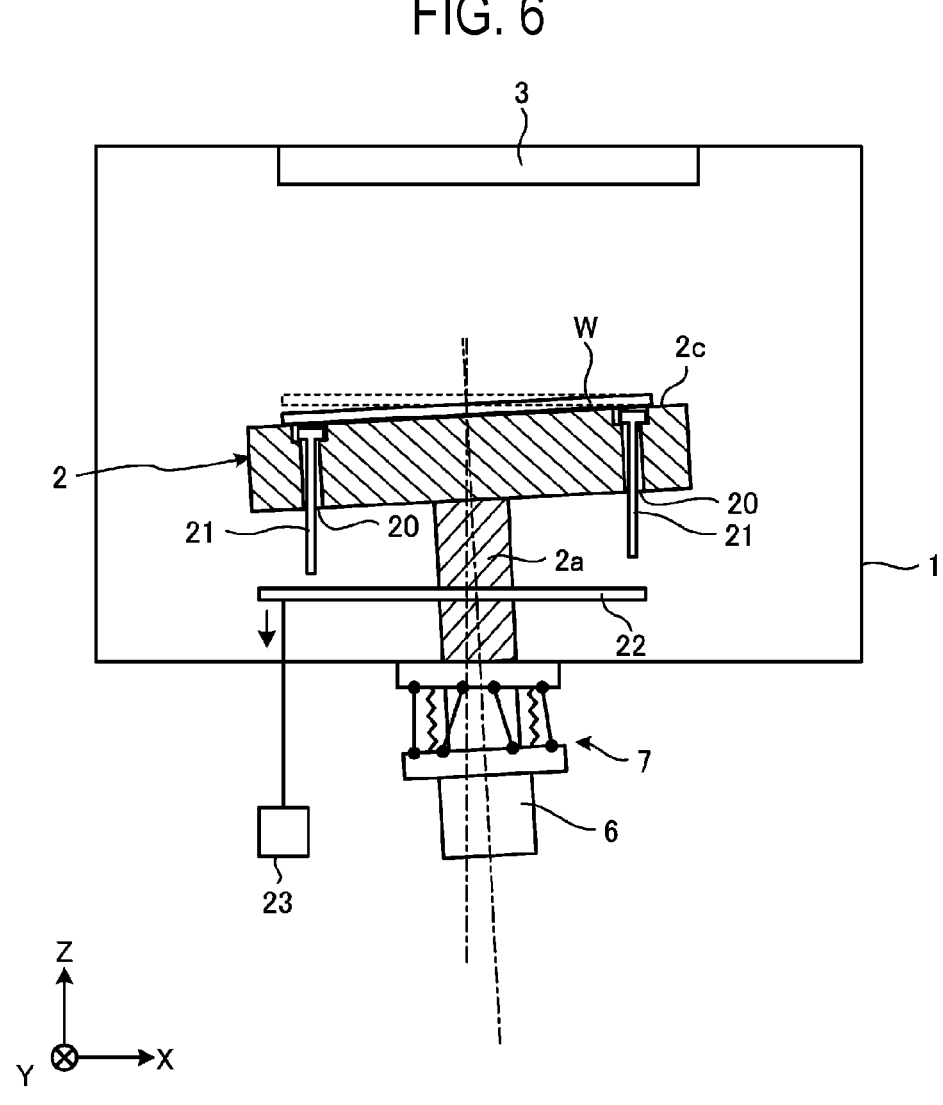
FIG. 6 is a view illustrating a specific example of a processing operation during carry-in of a substrate in the vacuum processing apparatus according to an embodiment.

After adjusting the inclination of the stage 2 and receiving the substrate W by the lift pins 21, the controller 102 lowers the lift pins 21 to place the substrate W on the inclined placement surface 2c (step S12, placing step). That is, for example, as illustrated in FIG. 6, the controller 102 controls the driving mechanism 23 to lower the lifting member 22. When the lifting member 22 is lowered, the lift pins 21 supported by the lifting member 22 are lowered together with the lifting member 22, and the substrate W is placed on the inclined placement surface 2c. When the substrate W, which is horizontally supported by the lift pins 21, is placed on the inclined placement surface 2c, the substrate W gradually comes into contact with the placement surface 2c from the relatively high edge side of the placement surface 2c (the right edge in FIG. 6) toward the relatively low edge side of the placement surface 2c (the left edge in FIG. 6). In FIG. 6, the substrate W which is in contact with the vicinity of the relatively high edge (the right edge in FIG. 6) of the placement surface 2c is indicated by a broken line. In this way, when the horizontally supported substrate W gradually comes into contact with the inclined placement surface 2c, even when gas remains between the substrate W and the placement surface 2c of the stage 2, the gas can be released from the relatively low edge side of the placement surface 2c (the left edge in FIG. 6). As a result, it is possible to suppress the positional deviation of the substrate W on the placement surface 2c of the stage 2 caused by the remaining gas.

Figure 7:
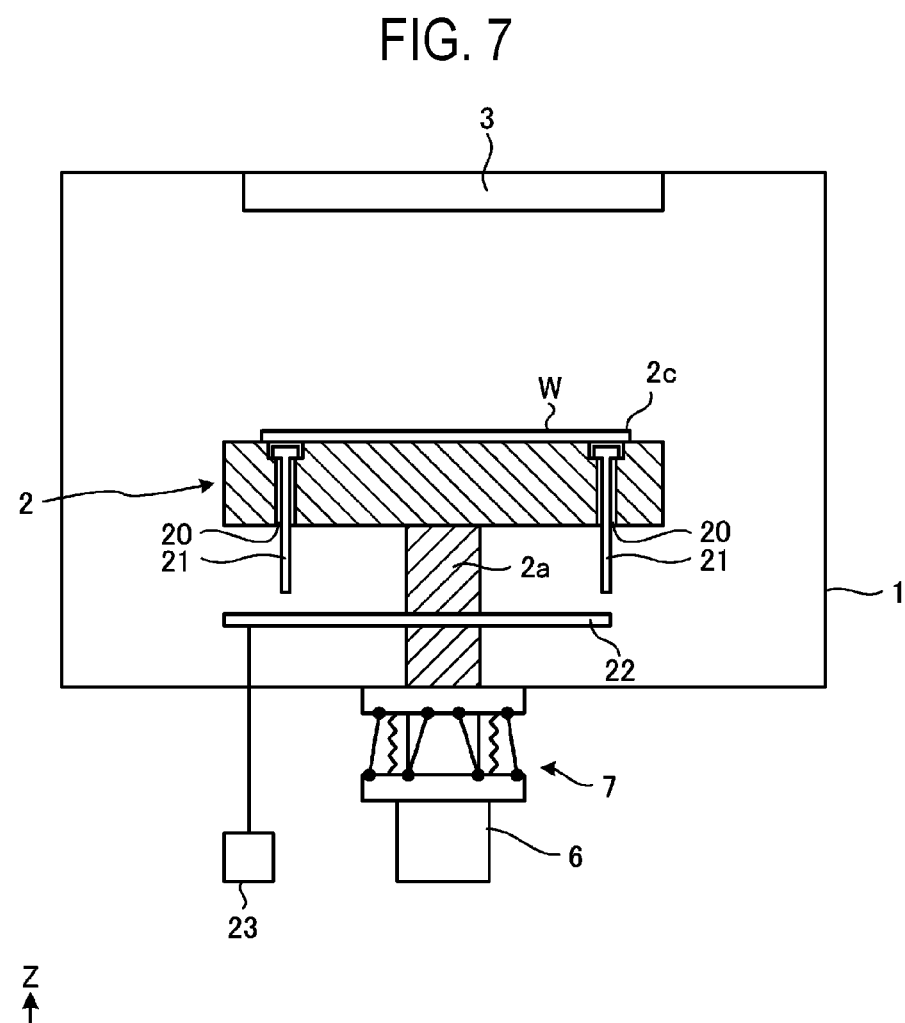
FIG. 7 is a view illustrating a specific example of a processing operation during carry-in of a substrate in the vacuum processing apparatus according to an embodiment.

Thereafter, the controller 102 adjusts the inclination of the stage 2 such that the placement surface 2c on which the substrate W is placed is parallel to the horizontal plane (step S13, second inclination adjusting step). That is, for example, as illustrated in FIG. 7, the controller 102 controls the adjustment mechanism 7 to adjust the inclination of the stage 2 until the inclination angle θ of the placement surface 2c with respect to the horizontal plane becomes zero. This is the processing operation when the substrate W is carried into the vacuum processing apparatus 100 according to an embodiment.

An example in which, in the first inclination adjusting step, the inclination of the stage 2 is adjusted so that the placement surface 2c is inclined in a posture in which the height at the position of a specific lift pin 21 among the lift pins 21 is the lowest is illustrated, but the posture of the placement surface 2c is not limited thereto. For example, in the first inclination adjusting step, the inclination of the stage 2 may be adjusted such that the placement surface 2c is inclined in a posture in which the heights at the positions of the lift pins 21 gradually decrease along the circumferential direction of the placement surface 2c.

An example in which, in the above-described placing step, the substrate W is placed on the inclined placement surface 2c by lowering the lift pins 21, but the substrate W may be placed on the placement surface 2c by raising the stage 2. Alternatively, the substrate W may be placed on the placement surface 2c by lowering the lift pins 21 and raising the stage 2. The raising of the stage 2 may be implemented by the controller 102 controlling the adjustment mechanism 7.

In the above-described placing step, when being placed on the inclined placement surface 2c, the substrate W comes into contact with the placement surface 2c from the relatively high edge side of the placement surface 2c (the right edge in FIG. 6), and the substrate W rotates around the contact position toward the placement surface 2c. That is, the substrate W is gradually inclined around the contact position with the relatively high placement surface 2c as a fulcrum. As the substrate W rotates, the center of the substrate W placed on the placement surface 2c is slightly deviated from the center of the placement surface 2c.

Figure 8:
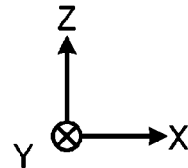
FIG. 8 is a view illustrating an example of a deviation amount indicated by positional deviation information.

Therefore, in the above-described placing step, the controller 102 may adjust the position of the stage 2 before lowering the lift pins 21 to correct the positional deviation between the center of the placement surface 2c and the center of the substrate W placed on the placement surface 2c. Specifically, first, the controller 102 acquires, from the memory of the controller 102, positional deviation information indicating the deviation amount between the edge position of the substrate W and a predetermined reference edge position in the case where the substrate W is placed on the inclined placement surface 2c. The reference edge position is the edge position of the substrate W when the substrate W is normally mounted on the placement surface 2c (that is, when the substrate W is placed on the placement surface 2c such that the center of the placement surface 2c and the center of the substrate W placed on the placement surface 2c are aligned with each other). FIG. 8 is a view illustrating an example of a deviation amount indicated by positional deviation information. In FIG. 8, the substrate W placed on the placement surface 2c such that the center of the placement surface 2c and the center of the substrate W placed on the placement surface 2c are aligned with each other is indicated by a broken line. The deviation amount a between the edge position of the substrate W and the reference edge position when the substrate W is placed on the inclined placement surface 2c is represented by a=(R−R cos θ)/2 assuming that the diameter of the substrate W is R and the inclination angle of the placement surface 2c with respect to the horizontal plane is θ. Subsequently, the controller 102 controls the adjustment mechanism 7 to adjust the position of the stage 2 based on the positional deviation information. That is, the controller 102 adjusts the horizontal position of the stage 2 such that the deviation amount a indicated by the positional deviation information becomes zero. As a result, since the edge position of the substrate W and the reference edge position are aligned with each other when the substrate W is placed on the inclined placement surface 2c, it is possible to correct the positional deviation between the center of the placement surface 2c and the center of the substrate W placed on the placement surface 2c. After adjusting the position of the stage 2, the controller 102 lowers the lift pins 21. This makes it possible to place the substrate W on the placement surface 2c such that the center of the placement surface 2c and the center of the substrate W placed on the placement surface 2c are aligned with each other.

[Processing Operation During Carry-Out of Substrate]

In the vacuum processing apparatus 100, reaction by-products (so-called deposits) accumulate on the stage 2 in the process of processing substrates W. The deposits deposited on the stage 2 are charged by a voltage supplied to the electrode inside the stage 2, and even if the voltage supplied to the electrode is released, the electric charges charged on the deposits may remain. When the deposits are charged, an attraction force corresponding to an electrostatic force remains between the placement surface 2c of the stage 2 and the substrate W. When the attractive force remaining between the placement surface 2c of the stage 2 and the substrate W is excessive, the substrate W may bounce when the lift pins 21 lift the processed substrate W.

Therefore, in the vacuum processing apparatus 100 of the present embodiment, when the substrate W is transported from the processing container 1 by the transport apparatus, the inclination of the stage 2 is adjusted by the adjustment mechanism 7 so that the placement surface 2c is inclined with respect to the horizontal plane. Then, in the vacuum processing apparatus 100, the substrate W is lifted from the inclined placement surface 2c by raising the lift pins 21 from the stage 2. As a result, even when an attractive force remains between the placement surface 2c of the stage 2 and the substrate W, it is possible to gradually separate the substrate W from the relatively low edge side of the placement surface 2c. As a result, in the vacuum processing apparatus 100 of the present embodiment, it is possible to prevent the substrate W from bouncing by gradually releasing the contact between the placement surface 2c and the substrate W.

Figure 9:
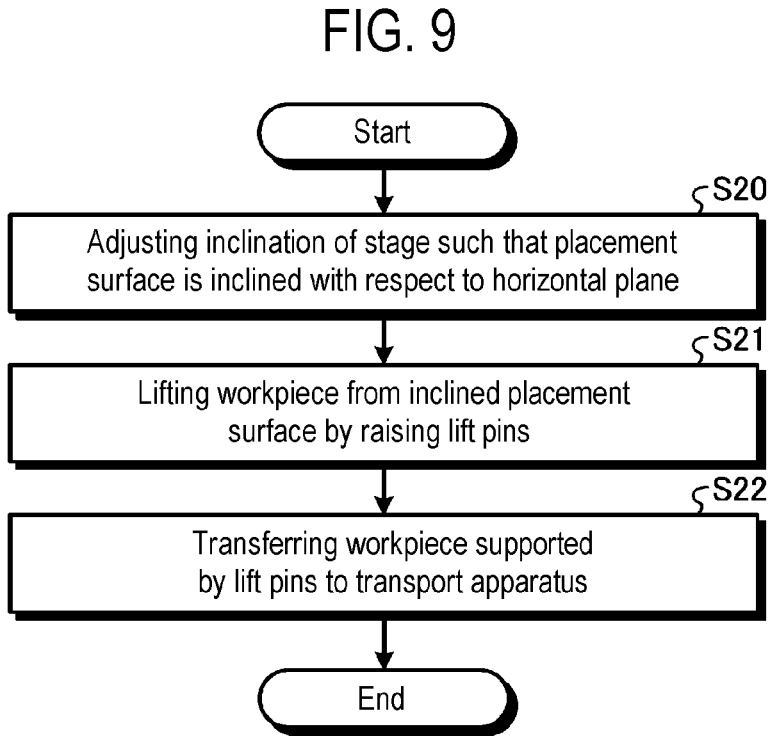
FIG. 9 is a flowchart illustrating an example of processing operations during carry-out of a substrate in the vacuum processing apparatus according to an embodiment.
Figure 10:
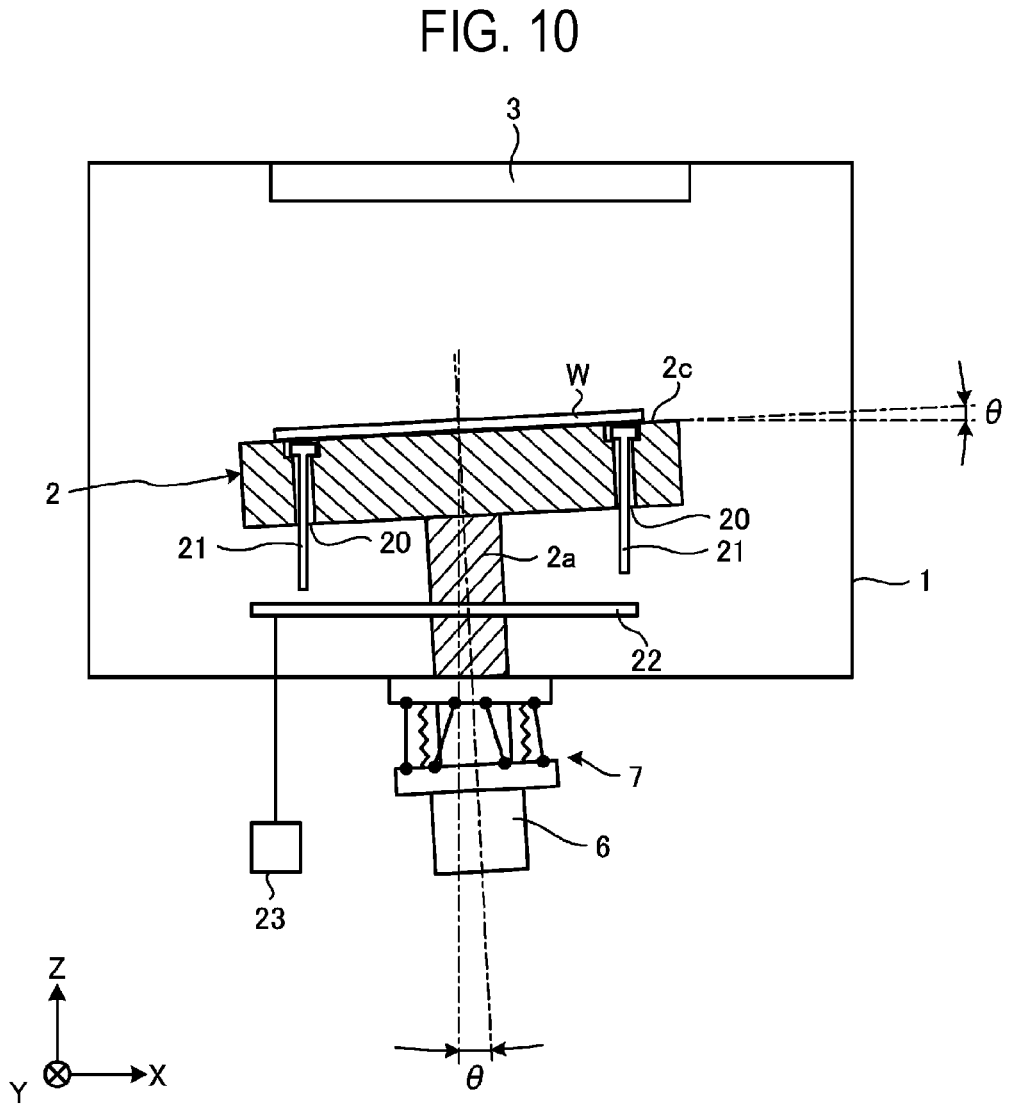
FIG. 10 is a view illustrating a specific example of a processing operation during carry-out of a substrate in the vacuum processing apparatus according to an embodiment.
Figure 11:
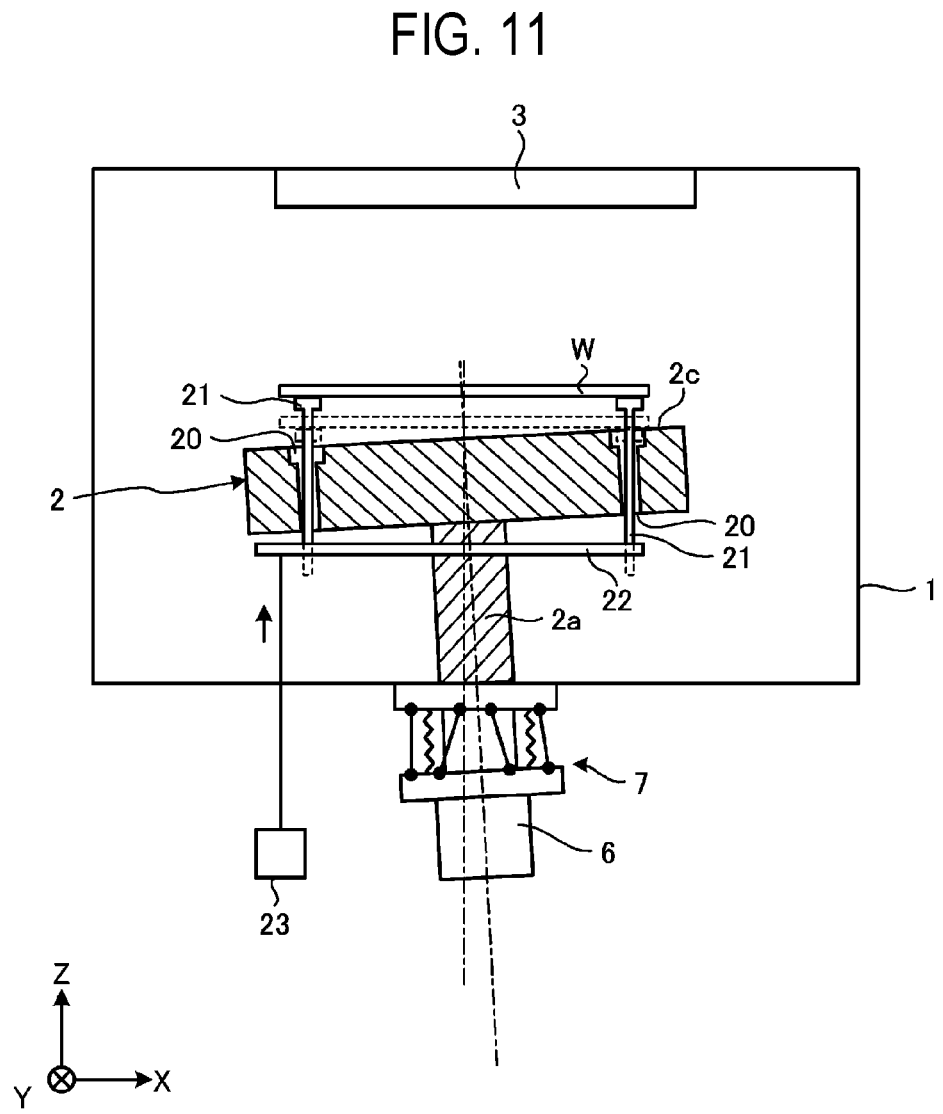
FIG. 11 is a view illustrating a specific example of a processing operation during carry-out of a substrate in the vacuum processing apparatus according to an embodiment.
Figure 12:
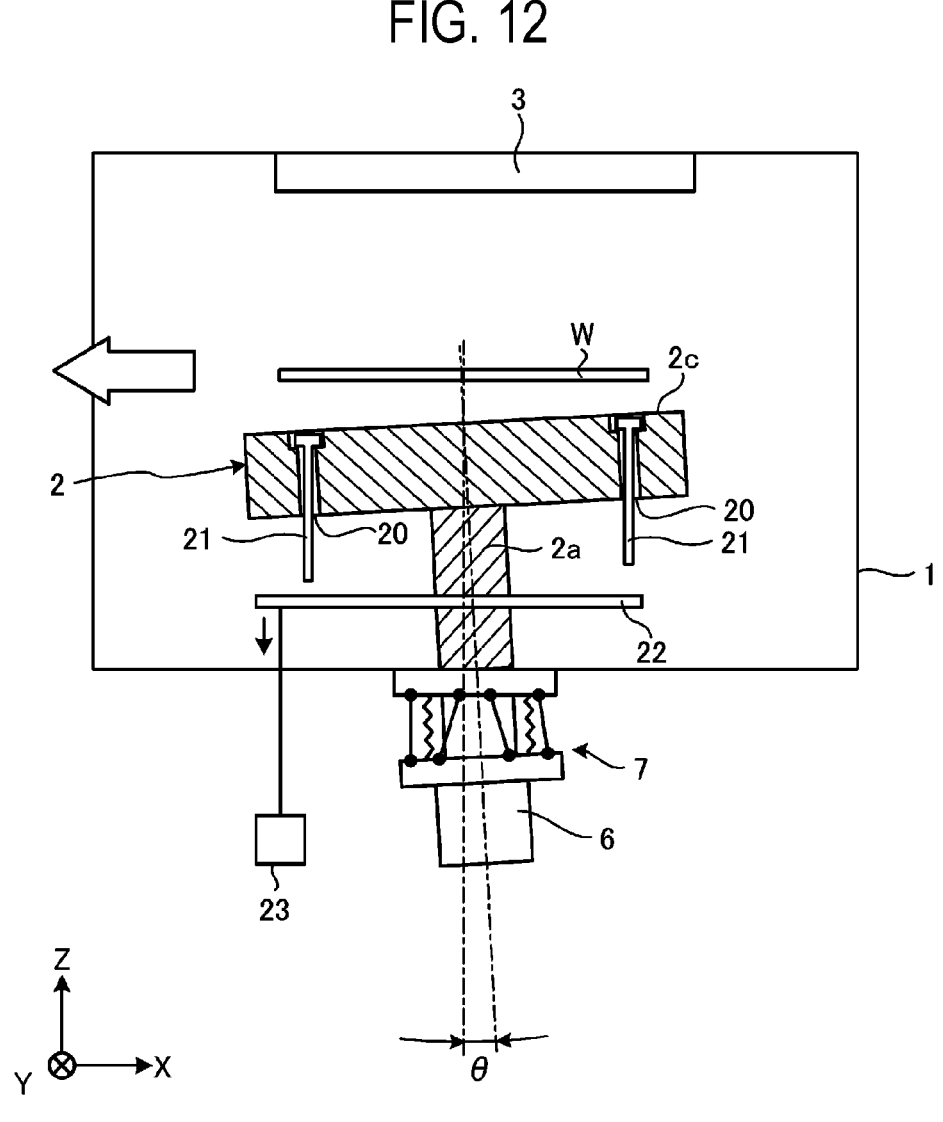
FIG. 12 is a view illustrating a specific example of a processing operation during carry-out of a substrate in the vacuum processing apparatus according to an embodiment.

FIG. 9 is a flowchart illustrating an example of the processing operation when the substrate W is carried out from the vacuum processing apparatus 100 according to an embodiment. FIGS. 10 to 12 are views illustrating a specific example of processing operations during carry-out of a substrate W from the vacuum processing apparatus 100 according to an embodiment. Each step illustrated in FIG. 9 is implemented by the controller 102 controlling each part of the main body 101.

The inclination of the stage 2 is set such that the placement surface 2c is parallel to the horizontal plane during the period in which the carry-in/out of the substrate W is not performed. During the carry-out of the substrate W, the controller 102 adjusts the inclination of the stage 2 such that the placement surface 2c is inclined with respect to the horizontal plane (step S20, third inclination adjusting step). That is, for example, as illustrated in FIG. 10, the controller 102 controls the adjustment mechanism 7 to adjust the inclination of the stage 2 such that the placement surface 2c is inclined at an inclination angle θ with respect to the horizontal plane. At this time, the controller 102 adjusts the inclination of the stage 2 such that the placement surface 2c is inclined in a posture in which the height at the position of a specific lift pin 21 (the left lift pin 21 in FIG. 10) among the lift pins 21 is the lowest height. The inclination angle θ of the placement surface 2c with respect to the horizontal plane is preferably, for example, 0.5 degrees or more and 2 degrees or less from the viewpoint of suppressing the slide-down of the substrate W placed on the placement surface 2c, and the viewpoint of implementing separating the substrate W from the placement surface 2c.

When the inclination of the stage 2 is adjusted, the controller 102 raises the lift pins 21 to lift the substrate W from the inclined placement surface 2c (step S21, lifting step). That is, for example, as illustrated in FIG. 11, the controller 102 controls the driving mechanism 23 to raise and bring the lifting member 22 into contact with the lower ends of the lift pins 21. When the lifting member 22 is raised, the lift pins 21 supported by the lifting member 22 are raised together with the lifting member 22 to protrude from the placement surface 2c of the stage 2 and lift the substrate W from the inclined placement surface 2c. Since the lift pins 21 have the same length, the tips of the lift pins 21 are located on the same horizontal plane. For this reason, when the lift pins 21 protrude from the inclined placement surface 2c, the substrate W comes into first contact with a specific lift pin 21 (the left lift pin 21 in FIG. 11) located at the relatively low edge side of the placement surface 2c (the left edge in FIG. 11). As a result, the substrate W is gradually separated from the relatively low edge of the placement surface 2c (the left edge in FIG. 11) by the lift pins 21. In FIG. 11, the substrate W, which is separated from the placement surface 2c by being brought into first contact with the specific lift pin 21 (e.g., the left lift pin 21 in FIG. 11) located at the relatively low edge side of the placement surface 2c (the left edge in FIG. 11), is indicated by a dashed line. In this way, since the substrate W is gradually separated from the relatively low edge side of the placement surface 2c (the left edge in FIG. 11) by the lift pins 21, it is possible to suppress the bouncing of the substrate W by gradually releasing the contact between the placement surface 2c and the substrate W.

In the state in which the substrate W is lifted from the placement surface 2c by the lift pins 21, an arm of a transport apparatus enters the processing container 1 and stops below the substrate W. Thereafter, the controller 102 transfers the substrate W supported by the lift pins 21 to the transport apparatus by lowering the lift pins 21 (step S22, transferring step). That is, for example, as illustrated in FIG. 12, the controller 102 controls the driving mechanism 23 to lower the lifting member 22. When the lifting member 22 is lowered, the lift pins 21 supported by the lifting member 22 are lowered together with the lifting member 22, and the substrate W supported by the lift pins 21 is received by the arm (not illustrated) of the transport apparatus. The arm of the transport apparatus moves to the exterior of the processing container 1 in the state of holding the substrate W to carry out the substrate W from the processing container 1. This is the processing operation when the substrate W is carried out from the vacuum processing apparatus 100 according to an embodiment.

Figure 13:
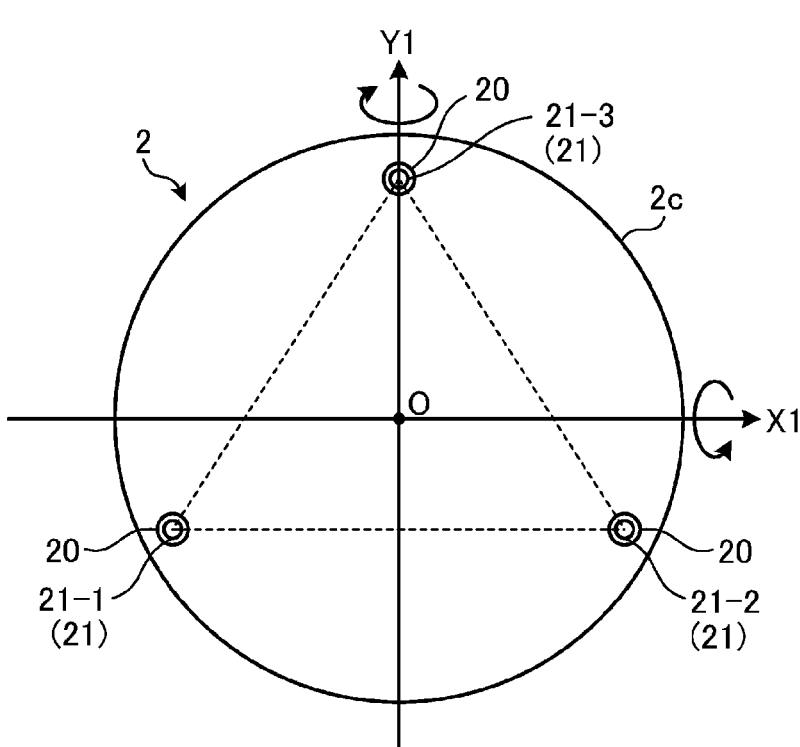
FIG. 13 is a view illustrating an example of inclination adjustment of the stage.
Figure 13:
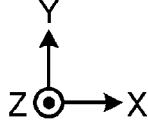

An example in which, in the third inclination adjusting step, the inclination of the stage 2 is adjusted so that the placement surface 2c is inclined in a posture in which the height at the position of a specific lift pin 21 among the lift pins 21 is the lowest is illustrated, but the posture of the placement surface 2c is not limited thereto. For example, in the third inclination adjusting step, the inclination of the stage 2 may be adjusted such that the placement surface 2c is inclined in a posture in which the heights at the positions of the lift pins 21 gradually decrease along the circumferential direction of the placement surface 2c. The inclination adjustment of the stage 2 will be described with reference to FIG. 13. FIG. 13 is a view illustrating an example of inclination adjustment of the stage 2. In FIG. 13, the placement surface 2c of the stage 2 is illustrated in a disk shape. In FIG. 13, lift pins 21-1 to 21-3 are illustrated as the lift pins 21 for convenience of description. In FIG. 13, the axis X1 is an axis that is parallel to the line segment connecting the positions of the lift pins 21-1 and 21-2 and passes through the center O of the placement surface 2c, and the axis Y1 is an axis that is orthogonal to the axis X1 and passes through the center O of the placement surface 2c. In the third inclination adjusting step, first, the inclination of the stage 2 is adjusted such that the placement surface 2c rotates in the rotation direction around the axis X1 illustrated in FIG. 13. As a result, the placement surface 2c is inclined in a posture in which the height at the positions of the lift pins 21-1 and 21-2 is lower than the height at the position of the lift pin 21-3. Subsequently, in the third inclination adjusting step, the inclination of the stage 2 is adjusted such that the placement surface 2c rotates in the rotation direction around the axis Y1 illustrated in FIG. 13. As a result, the placement surface 2c is inclined in a posture in which the height of the placement surface 2c is gradually lowered in the order of positions of the lift pins 21-3, 21-2, and 21-1 along the circumferential direction of the placement surface 2c. In this way, the inclination of the stage 2 is adjusted such that the placement surface 2c is inclined in a posture in which the heights at the positions of the lift pins 21 are gradually lowered along the circumferential direction of the placement surface 2c. When the lift pins 21 are raised and protrude from the placement surface 2c in the state in which the placement surface 2c is inclined in such a posture, the substrate W comes into contact with the lift pins 21 in order along the circumferential direction of the placement surface 2c. In the example of FIG. 13, the substrate W comes into contact with the lift pins 21-1, 21-2, and 21-3 in the order of the lift pins 21-1, 21-2, and 21-3 along the circumferential direction of the placement surface 2c. As a result, the substrate W is gradually separated from the placement surface 2c along the circumferential direction by the lift pins 21, and as a result, it is possible to more stably suppress the bouncing of the substrate W.

In addition, in the third inclination adjusting step, depending on the cumulative number of substrates W transported by the transport apparatus, the location at which the height of the placement surface 2c after being inclined is the lowest may be sequentially switched to the positions of the lift pins 21 along the circumferential direction of the placement surface 2c. As a result, since the lift pin 21, which comes into first contact with the substrate W is switched depending on the cumulative number of transported substrates W, it is possible to avoid wearing-out of only a specific lift pin 21 among the lift pins 21.

Effect

A method for transporting a workpiece according to an embodiment described above includes step (a) (e.g., step S10, first inclination adjusting step), step (b) (e.g., step S11, receiving step), step (c) (e.g., step S12, placing step), and step (d) (e.g., step S13, second adjusting step). In step (a), a stage (e.g., the stage 2) having the placement surface (e.g., the placement surface 2c) on which a workpiece (e.g., a substrate W) is capable of being placed is adjusted such that the placement surface is inclined with respect to the horizontal plane. In step (b), before or after step (a), by raising the lift pins (e.g., lift pins 21) provided in the stage to receive the workpiece from a transport apparatus that transports the workpiece. In step (c), by lowering the lift pins and/or raising the stage, the workpiece is placed on the inclined placement surface. In step (d), the inclination of the stage is adjusted such that the placement surface on which the workpiece is placed is parallel to the horizontal plane. As a result, according to the method for transporting a workpiece according to the embodiment, it is possible to suppress the positional deviation of a workpiece on the placement surface of the stage and dust generation from the lift pins.

In the above-described embodiments, the lift pins may be arranged at regular intervals along the circumferential direction of the placement surface. In step (a), the inclination of the stage may be adjusted such that the placement surface is tilted in a posture in which the height at the position of a specific lift pin among the lift pins is the lowest. As a result, according to the method for transporting a workpiece according to the embodiments, it is possible to align the location at which the height of the placement surface after being inclined is the lowest with the position of the specific lift pin.

In the above-described embodiments, the lift pins may be arranged at regular intervals along the circumferential direction of the placement surface. In addition, in step (a), the inclination of the stage may be adjusted such that the placement surface is inclined in a posture in which the heights at the positions of the lift pins are gradually lowered along the circumferential direction of the placement surface. As a result, according to the method for transporting a workpiece according to the embodiments, it is possible to gradually lower the height of the placement surface after being inclined along the circumferential direction of the placement surface.

In the above-described embodiments, step (c) may include steps (c-1), (c-2), and (c-3). In step (c-1), positional deviation information, which indicates a positional deviation amount between an edge position of the workpiece when the workpiece is placed on the inclined placement surface and a predetermined reference edge position, may be acquired. In step (c-2), the position of the stage may be adjusted based on the positional deviation information. In step (c-3), after adjusting the position of the stage, the lift pins may be lowered and/or the stage may be raised. As a result, according to the method for transporting a workpiece according to the embodiment, it is possible to place the workpiece on the placement surface such that the center of the placement surface and the center of the workpiece placed on the placement surface are aligned with each other.

A method for transporting a workpiece according to an embodiment described above includes step (e) (e.g., step S20, third inclination adjusting step), step (f) (e.g., step S21, lifting step), and step (g) (e.g., step S22, transferring step). In step (e), the inclination of the stage including the placement surface on which the workpiece is placed is adjusted such that the placement surface is inclined with respect to the horizontal plane. In step (f), the workpiece is lifted from the inclined placement surface by raising the lift pins provided in the stage. In step (g), the workpiece supported by the lift pins is transferred to a transport apparatus that transports the workpiece. As a result, according to the method for transporting a workpiece according to the embodiment, it is possible to prevent the workpiece from bouncing by gradually releasing the contact between placement surface and the workpiece.

In an embodiment described above, the lift pins may be arranged at regular intervals along the circumferential direction of the placement surface. In step (e), the inclination of the stage may be adjusted such that the placement surface is tilted in a posture in which the height at the position of a specific lift pin among the lift pins is the lowest. As a result, according to the method for transporting a workpiece according to the embodiment, it is possible to align the location at which the height of the placement surface after being inclined is the lowest with the position of the specific lift pin.

In an embodiment described above, the lift pins may be arranged at regular intervals along the circumferential direction of the placement surface. In addition, in step (e), the inclination of the stage may be adjusted such that the placement surface is inclined in a posture in which the heights at the positions of the lift pins are gradually lowered along the circumferential direction of the placement surface. As a result, according to the method for transporting a workpiece according to the embodiment, it is possible to gradually lower the height of the placement surface after being inclined along the circumferential direction of the placement surface. In addition, according to the method for transporting a workpiece according to the embodiment, the workpiece is gradually separated from the placement surface along the circumferential direction by the lift pins, and as a result, it is possible to more stably suppress the bouncing of the workpiece.

In an embodiment described above, in step (e), depending on the cumulative number of workpieces transported by the transport apparatus, the location at which the height of the placement surface after being inclined is the lowest may be sequentially switched to the positions of the lift pins along the circumferential direction of the placement surface. As a result, according to the method for transporting a workpiece according to the embodiment, since the lift pin, which comes into first contact with the workpiece, is switched depending on the cumulative number of transported workpieces, it is possible to avoid a situation where only a specific lift pin among the lift pins wears out.

In an embodiment described above, the lift pins may come into contact the lifting member at the lower ends thereof, and may be raised or lowered as the lifting member is raised or lowered. As a result, according to the method for transporting a workpiece according to the embodiment, when float-type lift pins are used, it is possible to suppress the positional deviation of a workpiece on the placement surface of the stage and dust generation from the lift pins. In addition, according to the method for transporting a workpiece according to the embodiment, when the float-type lift pins are used, it is possible to prevent the workpiece from bouncing by gradually releasing the contact between the placement surface and the workpiece.

In an embodiment described above, the inclination angle of the placement surface with respect to the horizontal plane may be 0.5 degrees or more and 2 degrees or less. As a result, according to the method for transporting a workpiece according to the embodiment, it is possible to prevent the workpiece from sliding down from the placement surface and to implement degassing from the gap between the placement surface and the workpiece. According to the method for transporting a workpiece according to the embodiment, it is possible to suppress sliding-down of the workpiece placed on the placement surface, and to implement separating of the workpiece from the placement surface.

OTHER MODIFICATIONS

The technology disclosed herein is not limited to the embodiments described above, and various modifications are possible within the scope of the gist the present disclosure.

For example, in an embodiment described above, the case where the lift pins 21 are float-type lift pins that are not fixed to the lifting member 22 has been described as an example, but the disclosed technology is not limited thereto. The lift pins 21 may be rigid-type lift pins. That is, the lift pins 21 may be fixed to the lifting member 22 at the lower ends thereof to be raised or lowered as the lifting member is raised or lowered. As a result, according to the method for transporting a workpiece according to a modification, when the rigid-type lift pins are used, it is possible to suppress the positional deviation of the workpiece on the placement surface of the stage and dust generation from the lift pins. In addition, according to the method for transporting a workpiece according to the modification, when the rigid-type lift pins are used, it is possible to prevent the workpiece from bouncing by gradually releasing the contact between the placement surface and the workpiece.

In the above-described embodiments, a vacuum processing apparatus 100 that processes a substrate W by using capacitively-coupled plasma (CCP) has been described as an example of a plasma source, but the plasma source is not limited thereto. Examples of plasma sources other than the capacitively coupled plasma include inductively coupled plasma (ICP), microwave-excited surface-wave plasma (SWP), electron cyclotron resonance plasma (ECP), and helicon-wave-excited plasma (HWP).

In the above-described embodiment, a vacuum processing apparatus 100 that performs film formation has been described as an example, but the technology of the disclosure is not limited thereto. That is, the technology disclosed herein is applicable to another vacuum processing apparatus such as an etching apparatus or a heating apparatus as long as the vacuum processing apparatus processes a substrate W under a depressurized environment.

It shall be understood that the embodiments disclosed herein are examples in all respects and are not restrictive. Indeed, the above-described embodiments can be implemented in various forms. The above-described embodiments may be omitted, replaced, or modified in various forms without departing from the scope and spirit of the appended claims.

According to the present disclosure, it is possible to suppress a positional deviation of a workpiece on a placement surface of a stage and dust generation from lift pins.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of transporting a workpiece, the method comprising steps of:

(a) adjusting an inclination of a stage including a placement surface on which the workpiece is to be placed such that the placement surface is inclined with respect to a horizontal plane;

(b) receiving the workpiece horizontally with respect to the horizontal plane from a transport apparatus configured to transport the workpiece by raising lift pins provided in the stage, before or after step (a);

(c) placing the workpiece on the inclined placement surface by performing at least one of lowering the lift pins or raising the stage; and (d) adjusting the inclination of the stage such that the placement surface on which the workpiece is placed is parallel to the horizontal plane, wherein step (c) includes steps of:

(c-1) acquiring positional deviation information, which indicates a positional deviation amount between an edge position of the workpiece when the workpiece is placed on the inclined placement surface and a predetermined reference edge position;

(c-2) adjusting a position of the stage based on the positional deviation information; and (c-3) performing at least one of lowering the lift pins or raising the stage, after adjusting the position of the stage.

2. The method of claim 1, wherein the lift pins are arranged at regular intervals along a circumferential direction of the placement surface, and wherein, in step (a), the inclination of the stage is adjusted such that the placement surface is inclined in a posture in which a height of the placement surface at a position of a specific lift pin among the lift pins is the lowest.

3. The method of claim 1, wherein the lift pins are configured to come into contact with a lifting member at lower ends of the lift pins, and are raised or lowered as the lifting member is raised or lowered.

4. The method of claim 1, wherein the lift pins are fixed to a lifting member at lower ends of the lift pins, and are raised or lowered as the lifting member is raised or lowered.

5. The method of claim 1, wherein an inclination angle of the placement surface with respect to the horizontal plane is 0.5 degrees or more and 2 degrees or less.

6. A method of transporting a workpiece, the method comprising steps of:

(a) adjusting an inclination of a stage including a placement surface on which the workpiece is to be placed such that the placement surface is inclined with respect to a horizontal plane;

(b) receiving the workpiece horizontally with respect to the horizontal plane from a transport apparatus configured to transport the workpiece by raising lift pins provided in the stage, before or after step (a);

(c) placing the workpiece on the inclined placement surface by performing at least one of lowering the lift pins or raising the stage; and (d) adjusting the inclination of the stage such that the placement surface on which the workpiece is placed is parallel to the horizontal plane, wherein the lift pins are arranged at regular intervals along a circumferential direction of the placement surface, and wherein, in step (a), the inclination of the stage is adjusted such that the placement surface is inclined in a posture in which heights of the placement surface at positions of the lift pins are gradually lowered along the circumferential direction of the placement surface.

7. The method of claim 6, wherein the lift pins are configured to come into contact with a lifting member at lower ends of the lift pins, and are raised or lowered as the lifting member is raised or lowered.

8. The method of claim 6, wherein the lift pins are fixed to a lifting member at lower ends of the lift pins, and are raised or lowered as the lifting member is raised or lowered.

9. The method of claim 6, wherein an inclination angle of the placement surface with respect to the horizontal plane is 0.5 degrees or more and 2 degrees or less.

10. A method of transporting a workpiece, the method comprising steps of:

(e) adjusting an inclination of a stage including a placement surface on which the workpiece is placed such that the placement surface is inclined with respect to a horizontal plane;

(f) lifting the workpiece from the inclined placement surface by raising lift pins provided in the stage; and (g) transferring the workpiece supported by the lift pins to a transport apparatus configured to transport the workpiece, wherein the lift pins are arranged at regular intervals along a circumferential direction of the placement surface, wherein, in step (e), the inclination of the stage is adjusted such that the placement surface is inclined in a posture in which a height of the placement surface at a position of a specific lift pin among the lift pins is the lowest, and wherein, in step (e), depending on a cumulative number of workpieces transported by the transport apparatus, a location at which the height of the placement surface after being inclined is the lowest is sequentially switched to positions of the lift pins in the circumferential direction of the placement surface.

11. The method of claim 10, wherein the lift pins are arranged at regular intervals along a circumferential direction of the placement surface, and wherein, in step (e), the inclination of the stage is adjusted such that the placement surface is inclined in a posture in which heights of the placement surface at positions of the lift pins are gradually lowered along the circumferential direction of the placement surface.

12. The method of claim 10, wherein the lift pins are configured to come into contact with a lifting member at lower ends of the lift pins, and are raised or lowered as the lifting member is raised or lowered.

13. The method of claim 10, wherein the lift pins are fixed to a lifting member at lower ends of the lift pins, and are raised or lowered as the lifting member is raised or lowered.

14. The method of claim 10, wherein an inclination angle of the placement surface with respect to the horizontal plane is 0.5 degrees or more and 2 degrees or less.

15. A processing apparatus comprising:

a stage including a placement surface on which a workpiece is to be placed;

an adjuster configured to adjust an inclination of the stage;

lift pins provided in the stage;

a lifter configured to raise and lower the lift pins; and a controller, wherein the controller is configured to cause each part of the processing apparatus to execute:

(a) adjusting the inclination of the stage such that the placement surface is inclined with respect to a horizontal plane;

(b) receiving the workpiece horizontally with respect to the horizontal plane from a transport apparatus configured to transport the workpiece by raising the lift pins, before or after step (a);

(c) placing the workpiece on the inclined placement surface by performing at least one of lowering the lift pins or raising the stage; and (d) adjusting the inclination of the stage such that the placement surface on which the workpiece is placed is parallel to the horizontal plane, wherein the lift pins are arranged at regular intervals along a circumferential direction of the placement surface, and wherein, in step (a), the inclination of the stage is adjusted such that the placement surface is inclined in a posture in which heights of the placement surface at positions of the lift pins are gradually lowered along the circumferential direction of the placement surface.

16. A processing apparatus comprising:

a stage including a placement surface on which a workpiece is to be placed;

an adjuster configured to adjust an inclination of the stage;

lift pins provided in the stage;

a lifter configured to raise and lower the lift pins; and a controller, wherein the controller is configured to cause each part of the processing apparatus to execute:

(e) adjusting the inclination of the stage on which the workpiece is placed such that the placement surface is inclined with respect to a horizontal plane;

(f) lifting the workpiece from the inclined placement surface by raising the lift pins; and (g) transferring the workpiece supported by the lift pins to a transport apparatus configured to transport the workpiece, wherein the lift pins are arranged at regular intervals along a circumferential direction of the placement surface, wherein, in step (e), the inclination of the stage is adjusted such that the placement surface is inclined in a posture in which a height of the placement surface at a position of a specific lift pin among the lift pins is the lowest, and wherein, in step (e), depending on a cumulative number of workpieces transported by the transport apparatus, a location at which the height of the placement surface after being inclined is the lowest is sequentially switched to positions of the lift pins in the circumferential direction of the placement surface.

* * * * *